US008624205B2

(12) United States Patent
Seto et al.

(10) Patent No.: US 8,624,205 B2
(45) Date of Patent: Jan. 7, 2014

(54) CHARGED PARTICLE BEAM WRITING APPARATUS AND DEVICE PRODUCTION METHOD

(75) Inventors: Isamu Seto, Utsunomiya (JP); Yoshio Suzaki, Utsunomiya (JP); Masamichi Kuwabara, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 23 days.

(21) Appl. No.: 12/683,158

(22) Filed: Jan. 6, 2010

(65) Prior Publication Data

US 2010/0178602 A1  Jul. 15, 2010

(30) Foreign Application Priority Data

Jan. 9, 2009  (JP) ................................. 2009-004126
Nov. 17, 2009  (JP) ................................. 2009-262074

(51) Int. Cl.
*H01J 37/147* (2006.01)
*G21K 5/04* (2006.01)
*G21K 1/08* (2006.01)
*G03F 7/20* (2006.01)

(52) U.S. Cl.
USPC ............... 250/492.22; 250/492.2; 250/492.23

(58) Field of Classification Search
USPC ............ 250/492.1–492.3, 503.1, 396 R, 397, 250/398–400, 396 ML
See application file for complete search history.

(56) References Cited

U.S. PATENT DOCUMENTS

| | | | | |
|---|---|---|---|---|
| 5,316,879 A | * | 5/1994 | Berger et al. | 430/5 |
| 5,414,267 A | * | 5/1995 | Wakalopulos | 250/492.3 |
| 5,973,333 A | * | 10/1999 | Nakasuji et al. | 250/492.23 |
| 6,014,200 A | * | 1/2000 | Sogard et al. | 355/53 |
| 6,175,122 B1 | * | 1/2001 | Groves et al. | 250/492.23 |
| 6,323,499 B1 | * | 11/2001 | Muraki et al. | 250/492.22 |
| 6,483,120 B1 | * | 11/2002 | Yui et al. | 250/491.1 |
| 6,566,664 B2 | | 5/2003 | Muraki | |
| 6,603,120 B2 | * | 8/2003 | Yamashita | 250/307 |
| 6,614,035 B2 | * | 9/2003 | Hartley | 250/492.23 |
| 6,703,630 B2 | * | 3/2004 | Kurokawa | 250/492.22 |
| 6,797,953 B2 | * | 9/2004 | Gerlach et al. | 850/16 |
| 6,903,353 B2 | | 6/2005 | Muraki | |
| 6,943,351 B2 | * | 9/2005 | Parker et al. | 850/6 |
| 6,946,665 B2 | * | 9/2005 | Muraki et al. | 250/492.1 |
| 7,034,297 B2 | * | 4/2006 | Petrov et al. | 250/310 |
| 7,105,842 B2 | * | 9/2006 | Tanimoto et al. | 250/492.22 |
| 7,223,974 B2 | * | 5/2007 | Petrov et al. | 250/310 |

(Continued)

FOREIGN PATENT DOCUMENTS

| | | |
|---|---|---|
| JP | 2001-267221 A | 9/2001 |
| JP | 2002-319532 A | 10/2002 |
| JP | 2005-116743 A | 4/2005 |

*Primary Examiner* — David A Vanore
*Assistant Examiner* — Wyatt Stoffa
(74) *Attorney, Agent, or Firm* — Canon U.S.A., Inc., IP Division (57) ABSTRACT

A charged particle beam writing apparatus includes an aperture array configured to be capable of forming a plurality of charged particle beams using a plurality of openings, an element array including a plurality of main elements and a plurality of auxiliary elements different from the main elements, and a control unit configured to acquire information associated with a defect of the plurality of main elements and control the element array in accordance with the information, wherein the control unit controls the element array such that only the main elements are used when there is no defect, while when there is a main element having a defect, an auxiliary element is used without using the main element having the defect.

5 Claims, 7 Drawing Sheets

(56) References Cited

U.S. PATENT DOCUMENTS

| | | | |
|---|---|---|---|
| 7,253,417 B2* | 8/2007 | Frosien et al. | 250/396 R |
| 7,304,320 B2* | 12/2007 | Nagano | 250/492.22 |
| 7,397,053 B2* | 7/2008 | Mizuno | 250/492.22 |
| 7,501,638 B1* | 3/2009 | Zhou | 250/396 R |
| 2003/0048064 A1* | 3/2003 | Ijzerman et al. | 313/426 |
| 2003/0141462 A1* | 7/2003 | Hartley | 250/492.23 |
| 2005/0104013 A1* | 5/2005 | Stengl et al. | 250/492.21 |
| 2005/0231699 A1* | 10/2005 | Butler | 355/55 |
| 2007/0158588 A1* | 7/2007 | Zhou et al. | 250/492.2 |
| 2008/0237460 A1* | 10/2008 | Fragner et al. | 250/307 |
| 2009/0114839 A1* | 5/2009 | LeChevalier | 250/396 R |
| 2009/0218509 A1* | 9/2009 | Ito et al. | 250/442.11 |
| 2009/0261267 A1* | 10/2009 | Wieland et al. | 250/396 R |
| 2010/0030522 A1* | 2/2010 | Tsuchiya et al. | 702/183 |
| 2010/0072403 A1* | 3/2010 | Abe et al. | 250/492.22 |
| 2010/0128069 A1* | 5/2010 | Hillis et al. | 345/690 |

\* cited by examiner

CHARGED PARTICLE BEAM WRITING APPARATUS AND DEVICE PRODUCTION METHOD

BACKGROUND OF THE INVENTION

1. Field of the Invention

The present invention relates to a charged particle beam writing apparatus configured to write a pattern on a substrate such as a wafer, a mask, or a reticle by using a plurality of charged particle beams.

2. Description of the Related Art

With an advancement in semiconductor production technology achieved in recent years, a great reduction in circuit pattern size and a great increase in integration density have been achieved. In such a situation, there is a great need for an increase in throughput to achieve higher productivity.

Thus, there is also a need for higher throughput in direct writing technology, which is a technique to directly write a pattern on a substrate using a charged particle beam and which is one of candidates for next-generation lithography technology.

To meet the above requirement in charged particle beam writing apparatuses, there is a trend toward increasing an area that can be irradiated with a charged particle beam at a time. An example of the charged particle beam writing technique is a point beam technique in which a charged particle beam generated in the form of a point in cross section is used. Another example is a variable rectangular beam technique in which a charged particle beam generated in the form of a variable rectangle in cross section is used. However, it is clear that these techniques are not suitable for mass production because they do not provide a high throughput in writing fine patterns with a high density. In another technique known as a cell projection technique, a particular pattern that appears frequently is written using a charged particle beam formed in a shape corresponding to the particular pattern using a cell mask. This technique is effective in particular for semiconductor circuits such as memory circuits in which the same pattern appears periodically. However, for semiconductor circuits such as logic circuits having patterns with low periodicity, it is necessary to prepare a cell mask for a large number of different patterns, which is practically difficult to achieve.

To solve the above problems, a particle beam writing apparatus of a multibeam type has been proposed (see, for example, Japanese Patent Laid-Open No. 2001-267221, Japanese Patent Laid-Open No. 2002-319532, and Japanese Patent Laid-Open No. 2005-116743). In the charged particle beam writing apparatus of this type, a substrate is irradiated with a plurality of charged particle beams. The substrate is scanned by the beams while simultaneously deflecting the plurality of charged particle beams. A pattern is formed by controlling the plurality of charged particle beams individually depending on the pattern to be written while scanning the beams across the substrate. This charged particle beam writing apparatus is capable of forming an arbitrary writing pattern without using a mask and can provide a large angle field that covers a large writing area, and thus an improvement in throughput can be achieved.

Figure 7:
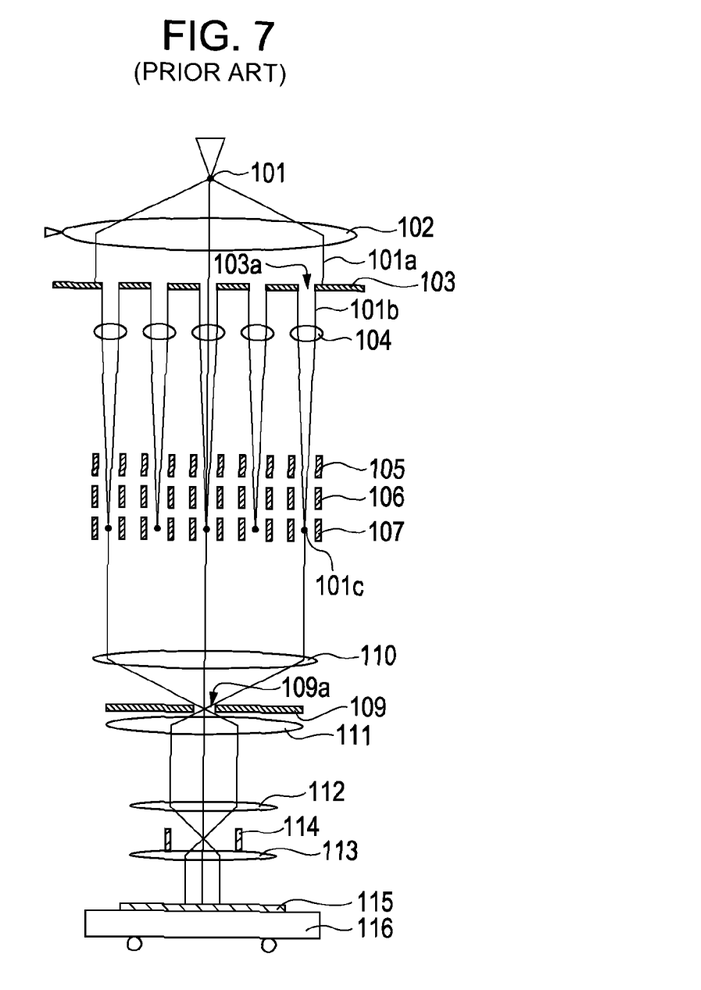
FIG. 7 is a diagram illustrating a conventional multibeam-type charged particle beam writing apparatus.

Referring to FIG. 7, an example of a multibeam-type charged particle beam writing apparatus is described below.

A charged particle beam emitted from an electron gun (not shown) is focused as a crossover image 101 and is passed through a condenser lens 102 to obtain a collimated charged particle beam 101a. An aperture array 103 has a plurality of openings 103a arranged in the form of a two-dimensional array. A lens array 104 has a plurality of electron lenses arranged in the form of a two-dimensional array. Deflector arrays 105, 106, and 107 each have a plurality of deflectors arranged in the form of a two-dimensional array. Each deflector can be controlled independently.

The charged particle beam 101a is divided into a plurality of charged particle beams 101b by openings 103a of the aperture array 103. Each of the plurality of charged particle beams 101b formed is passed through a corresponding electron lens of the lens array 104 thereby forming an intermediate image 101c of the crossover image 101 at a height corresponding to the deflector array 107. In this process, the deflectors of the deflector arrays 105 and 106 are controlled individually such that the intermediate image 101c of each charged particle beam 101b passes through a predetermined location in the deflector array 107.

The deflector array 107 controls the plurality of charged particle beams 101b to fall on a substrate 115 or to be blocked independently for each of the plurality of charged particle beams 101b. That is, a charged particle beam 101b that is deflected by the deflector array 107 is blocked by a blanking aperture (blocking plate) 109 and does not reach the substrate 115. On the other hand, a charged particle beam that is not deflected by the deflector array 107 passes through an opening 109a of the blanking aperture 109 via an electron lens 110 and reaches the substrate 115 via electron lenses 111, 112, and 113. A deflector 114 deflects charged particle beams in a direction perpendicular to a scanning direction of a stage 116.

Figure 8:
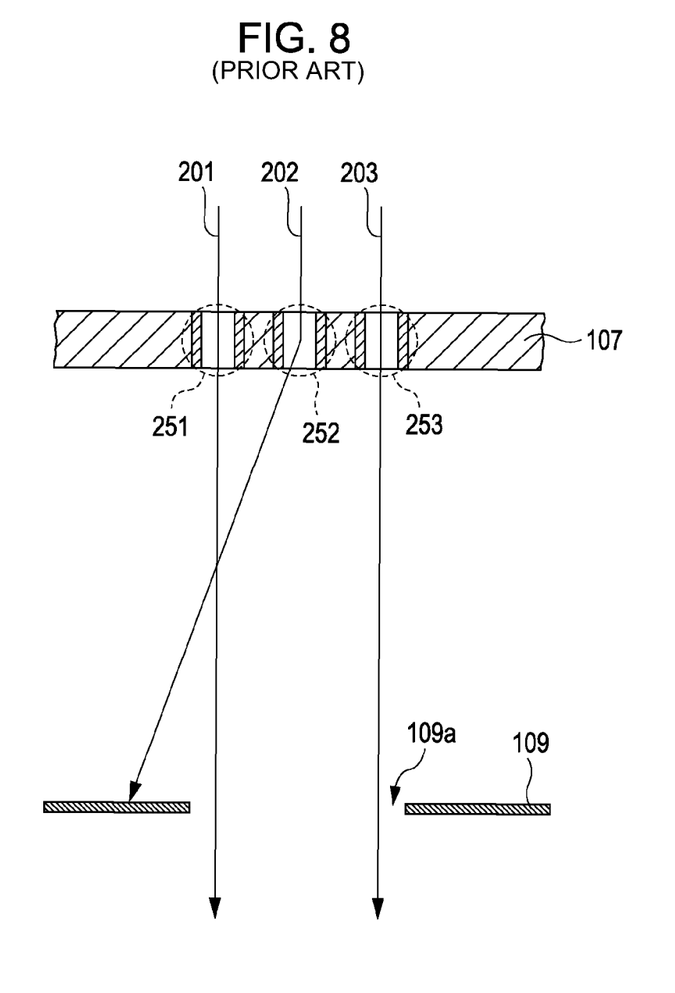
FIG. 8 is a diagram illustrating an operation of a conventional deflector array.

Referring to FIG. 8, the deflector array 107 is described in further detail below. Note that, for simplicity, the electron lens 110 in FIG. 7 is not shown in FIG. 8. Charged particle beams 201, 202, and 203 are controlled by deflectors 251, 252, and 253 of the deflector array 107 in such a manner as described below. When the deflectors 251 and 253 are controlled such that no deflection is performed, the charged particle beams 201 and 203 pass through an opening 109a of a blanking aperture 109 and reach the substrate 115.

On the other hand, by controlling the deflector 252 to perform deflection, the path of the charged particle beam 202 can be changed such that the charged particle beam 202 strikes an area outside the opening 109a of the blanking aperture 109 without reaching the substrate 115. In the present example, of the deflectors 251, 252, and 253, only the deflector 252 performs deflection. Note that all deflectors may perform deflection or any deflector may not perform deflection. A desired pattern is formed on the substrate 115 by switching whether or not each deflector performs deflection depending on the position on the substrate.

In the conventional multibeam-type charged particle beam writing apparatus, if a defect occurs in an element such as a deflector, following problems can occur.

(1) It can become impossible for a particular charged particle beam to reach the substrate 115 (irradiation is not correctly performed).

(2) A particular charged particle beam can continue to strike the substrate 115 (necessary blocking is not performed).

(3) A particular charged particle beam can be moved to an unpredictable position (position control is not correctly performed).

To solve the above problems, Japanese Patent Laid-Open No. 2005-116743 discloses a technique in which a plurality of charged particle beams are deflected all together by a common blanker located above a deflector array (on the side of the charged particle beam source), and charged particle beams are deflected by normal deflectors of the deflector array such that the charged particle beams pass through openings of a blanking aperture. In this technique, a charged particle beam passing through a defective deflector in the deflector array is blocked by a non-opening part of the blanking aperture, and thus only normal deflectors are used in forming a pattern on a substrate.

However, in this technique, because charged particle beams corresponding to defective deflectors are not used in forming a pattern, an additional wiring process is needed to obtain a complete pattern. That is, writing is performed twice to obtain the complete pattern, which causes a reduction in throughput.

SUMMARY OF THE INVENTION

In view of the above, the present invention provides a charged particle beam writing apparatus capable of forming a desired pattern without a reduction in throughput even when elements such as deflectors include defective ones.

According to an aspect of the present invention, a charged particle beam writing apparatus includes an aperture array configured to be capable of forming a plurality of charged particle beams using a plurality of openings, an element array including a plurality of main elements and a plurality of auxiliary elements different from the main elements, and a control unit configured to acquire information associated with a defect of the plurality of main elements and control the element array in accordance with the information, wherein the control unit controls the element array such that only the main elements are used when there is no defect, while when there is a main element having a defect, an auxiliary element is used without using the main element having the defect.

Further features of the present invention will become apparent from the following description of exemplary embodiments with reference to the attached drawings.

DESCRIPTION OF THE EMBODIMENTS

First Embodiment

Figure 1:
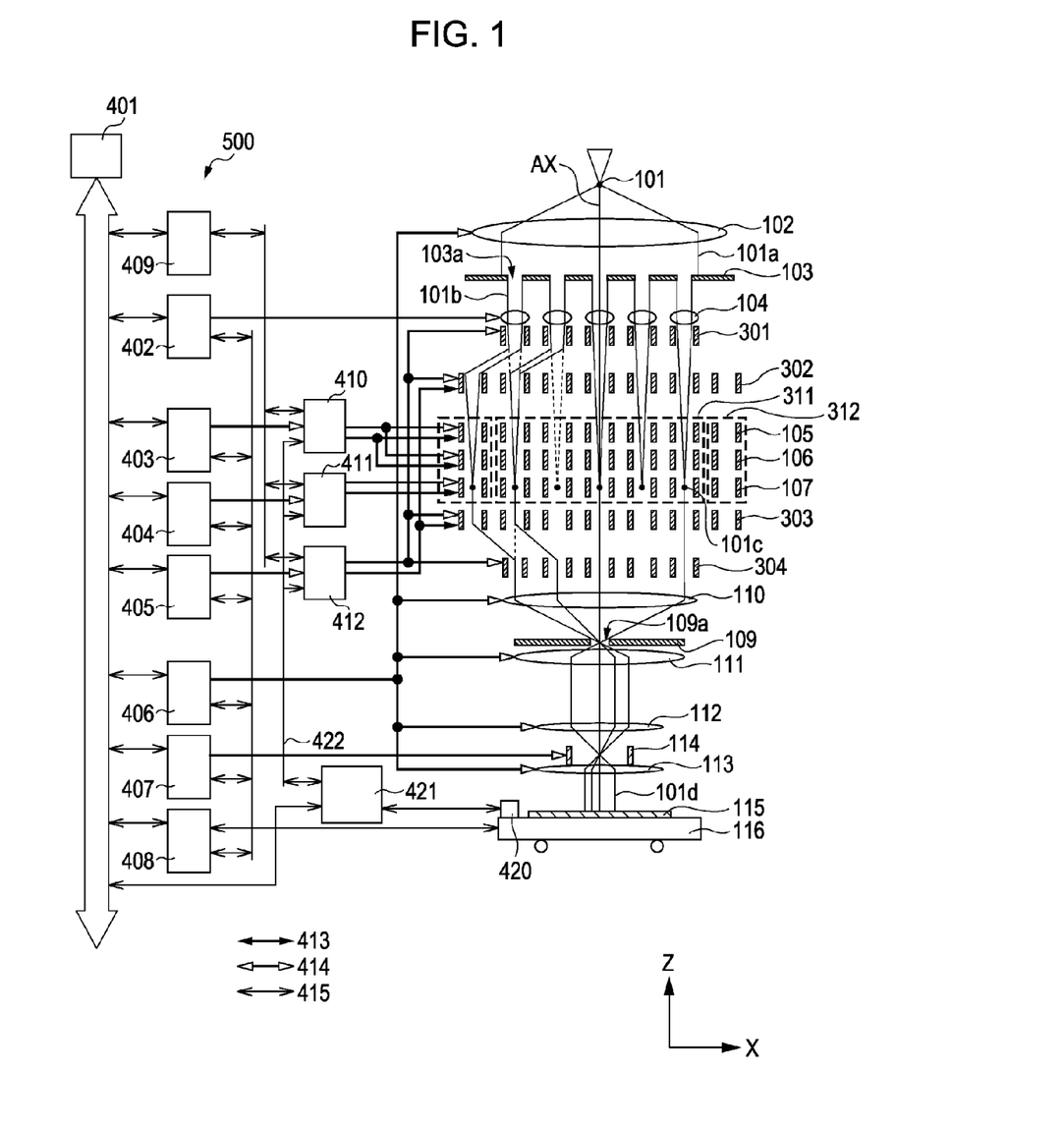
FIG. 1 is a diagram illustrating a multibeam-type charged particle beam writing apparatus according to an embodiment of the present invention.

Referring to FIG. 1, a multibeam-type charged particle beam writing apparatus according to a first embodiment of the present invention is described below. In FIG. 1, AX denotes a main axis (extending in a direction perpendicular to a substrate surface) of a plurality of charged particle beams. The direction of the main axis is defined as a Z direction, and two additional directions perpendicular to the Z direction are defined as an X direction and a Y direction.

A charged particle beam emitted from an electron gun (not shown) is focused as a crossover image 101 and is passed through a condenser lens (electron lens) 102 so as to obtain a collimated charged particle beam 101a. An aperture array 103 has a plurality of openings 103a arranged in the form of a two-dimensional array. A lens array 104 includes a plurality of electron lenses arranged in the form of a two-dimensional array. Deflector arrays 105, 106, and 107 each have a plurality of deflectors arranged in the form of a two-dimensional array. Each deflector can be controlled independently.

The aperture array 103 is capable of forming a plurality of charged particle beams 101b using a plurality of openings 103a. Each of the plurality of charged particle beams 101b formed is passed through a corresponding electron lens of the lens array 104 thereby forming an intermediate image 101c of the crossover image 101 at a height corresponding to the deflector array 107. In this process, the deflector arrays 105 and 106 are controlled such that the intermediate image 101c of each charged particle beam 101b passes through a predetermined location in the deflector array 107.

The deflector array 107 controls the plurality of charged particle beams 101b to fall on the substrate 115 or to be blocked by a blocking plate 109 independently for each of the plurality of charged particle beams 101b. That is, a charged particle beam 101b deflected by the deflector array 107 is blocked by the blocking plate 109 and does not reach the substrate 115. On the other hand, a charged particle beam that is not deflected by the deflector array 107 passes through an opening 109a formed in the blocking plate 109 via the electron lens 110 and reaches the substrate 115 via the electron lenses 111, 112, and 113. A deflector array 114 deflects charged particle beams in a direction perpendicular to a scanning direction of a stage 116 on which substrate 115 is mounted. On the stage 116, there is disposed a detector 420 for detecting charged particle beams.

In the present embodiment, a deflector array 301 (first deflector array) and deflector array 302 (third deflector array) are disposed above (upstream of) the deflector arrays 105, 106, and 107 and below (downstream of) the aperture array 103. Furthermore, a deflector array 303 (second deflector array) and a deflector array 304 (third deflector array) are disposed at locations below the deflector arrays 105, 106, and 107 and above the blocking plate 109. Deflectors of these deflector arrays are capable of deflecting corresponding charged particle beams of the plurality of charged particle beams.

The deflectors and the electron lenses described above may include a pair of electrodes opposing each other via an opening in a known manner. However, the configuration is not limited to that described above. For example, magnetic poles may be used instead of the electrodes.

A control unit 500 includes a controller module 402 that controls the lens array 104, a controller module 403 that controls the deflector arrays 105 and 106, a controller module 404 that controls the deflector array 107, and a controller module 406 that controls the electron lenses 102, 110, 111, 112, and 113. The control unit 500 further includes a controller module 407 that controls the deflector array 114, a controller module 408 that controls the driving of the stage, and a controller module 405 that controls the deflector arrays 301, 302, 303, and 304. These controller modules are configured to be capable of communicating with a main control unit 401.

The deflector arrays (element arrays) 105, 106, and 107 include a plurality of main deflectors (main elements) 311 disposed in areas corresponding to the plurality of openings 103a of the aperture array 103, and also include a plurality of auxiliary deflectors (auxiliary elements) 312 disposed in areas different from the above-described areas.

Figure 2:
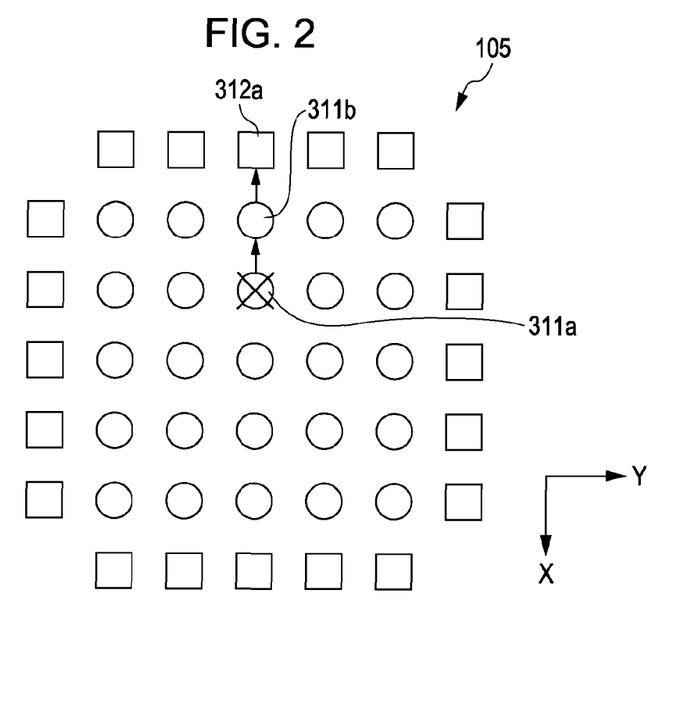
FIG. 2 is a top view of a deflector array according to an embodiment of the present invention.

FIG. 2 illustrates a view of the deflector array 105 shown in FIG. 1 as seen from above (from the side of the charged particle beam source). In the present embodiment, 5×5 charged particle beams are formed by the openings 103*a*. The main deflectors 311 are disposed at locations corresponding to those charged particle beams. In FIG. 2, the main deflectors 311 are illustrated by circles, and the auxiliary deflectors 312 are illustrated by squares.

In the present embodiment, as many main deflectors 311 are disposed in the form of a two-dimensional array as there are openings 103*a*, and the auxiliary deflectors 312 are disposed in a two-dimensional plane in which the main deflectors 311 are disposed such that the main deflectors 311 are surrounded by the auxiliary deflectors 312. Note that the configuration associated with the auxiliary deflectors 312 is not limited to the present example, but the auxiliary deflectors 312 may be arranged in other ways although there has to be at least one auxiliary deflector.

An operation is described below for a case in which part of the main deflectors 311 of the deflector arrays 105, 106, and 107 have a defect. If part of the deflector arrays 105 and 106 are uncontrollable due to a defect, the position control described above is not performed correctly, which makes it difficult to form a fine pattern. On the other hand, if part of the deflector arrays 107 are uncontrollable due to a defect, a pattern is formed at an incorrect location on a substrate without forming the pattern at a correct location. In the present embodiment of the invention, to avoid the above problem, an auxiliary deflector is used instead of a defective deflector to form a correct pattern.

The control unit 500 is capable of acquiring information associated with defects of the main deflectors 311. More specifically, defective deflectors of the plurality of main deflectors 311 are identified by a user via an interface or via an automatic detection performed by the apparatus. The control unit 500 controls the deflector arrays 301 and 302 such that part of the plurality of charged particle beams corresponding to the defective deflectors do not pass through the defective deflectors of the main deflectors 311 but instead pass through auxiliary deflectors. In the present embodiment, the deflector array 302 is disposed below the deflector array 301 so that the charged particle beams are incident at a right angle on a plane in which the deflectors of the deflector array 105 are disposed. In other words, the deflector array 302 deflects the charged particle beams incident thereon after passing through the deflector array 301 such that the charged particle beams become parallel (or substantially parallel) to the main axis AX of the plurality of charged particle beams. In a case where the distance between the deflector array 301 and the deflector array 105 is set to be large enough so that the charged particle beams incident on the deflector array 105 are substantially parallel, only the deflector 301 may be disposed without providing the deflector array 302.

Furthermore, the control unit 500 controls the deflector arrays 303 and 304 such that the charged particle beams passing through the auxiliary deflectors 312 further pass through the opening of the blocking plate 109. In the present embodiment, the deflector array 304 is disposed below the deflector array 303 such that the charged particle beams are incident at a right angle on the surface of the electron lens 110. In other words, the deflector array 304 deflects the charged particle beams incident thereon after passing through the deflector array 303 such that the charged particle beams become parallel (or substantially parallel) to the main axis AX of the plurality of charged particle beams. In a case where the distance between the deflector array 303 and the deflector array 107 is set to be large enough so that the charged particle beams incident on the electron lens 110 are substantially parallel, only the deflector 303 may be disposed without providing the deflector array 304. Note that the function of the deflector 303 may be provided by the deflector 107. In this case, the deflectors 303 and 304 may not be provided.

In FIG. 2, a charged particle beam passing though an opening 103*a* corresponding to a defective deflector 311*a* is deflected by the deflector arrays 301 and 302 such that the charged particle beam is led to a deflector 311*b* located outwardly adjacent to the defective deflector 311*a*. The charged particle beam that has passed through the opening 103*a* corresponding to the deflector 311*b* is deflected by the deflector arrays 301 and 302 such that the charged particle beam is led to an auxiliary deflector 312*a* located outwardly adjacent to the deflector 311*b*. That is, the deflectors used are shifted outwardly until the auxiliary deflector 312*a* is reached. After the charged particle beams have passed through the deflectors described above, the charged particle beams are deflected by the deflectors 303 and 304 such that the charged particle beams return to their original positions. Herein, the original position refers to a position that would be reached by the charged particle beam when the charged particle beam was not deflected by the deflectors 301 and 302. In the present embodiment, not only in the case where some deflectors of the deflector array 105 are defective but also in a case where some deflectors of the deflector arrays 106 and 107 are defective, the defective deflectors can be bypassed in a similar manner.

The control unit 500 further includes control signal exchanging circuits 410 and 411. The control signal exchanging circuits 410 and 411 are configured to exchange control signals applied to deflectors such as to form the same correct pattern as that obtained without using the deflector arrays 301, 302, 303, and 304 when there is no defect. In FIG. 1, reference numeral 413 denotes a control signal applied to the auxiliary deflectors, reference numeral 414 denotes a control signal applied to the main deflectors, and reference numeral 415 denotes other control signals.

In the present embodiment, the deflector arrays 301 and 302 are disposed above the deflector array 105, and the deflector arrays 303 and 304 are disposed below the deflector array 107 so that even when some deflectors of the deflector arrays 105, 106, and 107 are defective, a correct pattern can be written on the substrate by bypassing the defective deflectors. Note that the deflector arrays may be configured in other manners. For example, the deflector arrays 301 and 302 may be disposed above one of the deflector arrays 105, 106, and 107, and, below this one of the deflector arrays, the deflector arrays 303 and 304 may be disposed.

Note that the present invention may be applied not only to an array of deflectors but also to an array of other elements. For example, the lens array 104 may be configured to have auxiliary electron lenses, and the deflector arrays 301 and 302 may be disposed above the lens array 104 and the deflector arrays 303 and 304 may be disposed below the lens array 104.

Next, an explanation is given below as to a method of identifying a defective deflector in the plurality of main deflectors 311 automatically by the apparatus.

First, with predetermined timing, the detector 420 is moved together with the stage 116 to an irradiation location at which the detector 420 is to be irradiated with the charged particle beam 101*d*. The predetermined timing may be once every substrate or once every lot. The timing may be set by a user as required. At this irradiation location, the detector 420 is irradiated with the charged particle beam via the main deflector 311 such that the charged particle beam is detected by the detector 420. As for the detector 420, for example, a combination of a Faraday cup and an ammeter may be used.

Note that the number of Faraday cups is not limited to one, but a plurality of Faraday cups may be disposed in the form of an array. This configuration allows it to simultaneously detect a plurality of charged particle beams, which allows a reduction in detection time.

A controller module 421 includes a storage unit in which a current value required to perform writing is stored in advance. The controller module 421 compares a current value detected by the detector 420 with the current value stored in advance to determine whether the detected current value is normal. A current value in a state in which there is no irradiation of charged particle beam is also stored in advance in the storage unit. A current value is measured in a state in which a charged particle beam is deflected by a deflector array and the deflected charged particle beam is blocked by the blocking plate 109, and the current value detected by the detector 420 in this state is compared with the current value measured in advance in the state where no irradiation is performed. From the comparison, a determination is made as to whether the charged particle beam is deflected normally. Via the process described above, it is determined whether the deflector arrays 105, 106, and 107 have a defective deflector.

In a case where it is determined that there is a defective deflector, the control signal exchanging circuits 410 and 411 exchange the control signal output from the controller modules 403 and 404 such that the defective deflector is bypassed, and the controller module 412 controls the deflectors 301, 302, 303, and 304 such that the defective deflector is bypassed. By exchanging the controls signal in the above-described manner, it becomes possible to simplify the control system.

In the present embodiment, as described above, even when an array of elements has a defective element, it is possible to continuously perform writing on a substrate. This makes it possible to replace the defective element with a normal element when the apparatus is not used, for example, when the apparatus is subjected to a maintenance operation, and thus it is possible to increase the throughput of the apparatus.

When some deflector is defective, an auxiliary deflector is used instead of the defective deflector, which allows the plurality of charged particle beams to be fully used without waste. In contrast, in the conventional techniques, a charged particle beam passing through a defective deflector is blocked by a blocking plate, and thus the blocked charged particle beam functions as an unnecessary heat source. In the present embodiment, no unnecessary heat source is created, which reduces the necessity of taking measures against an influence of heat on heat-sensitive parts. Furthermore, in contrast to the conventional techniques that need to perform the writing process twice or more to obtained a complete pattern, the present embodiment allows it to form a pattern by perform the writing process only once, which provides a great advantage in terms of the throughput.

Second Embodiment

A second embodiment is described below. The second embodiment is similar to the first embodiment except for what is described below. In the second embodiment, when a plurality of defective main deflectors are defective, the defectiveness is handled in such a manner as described below with reference to FIG. 3.

Figure 3:
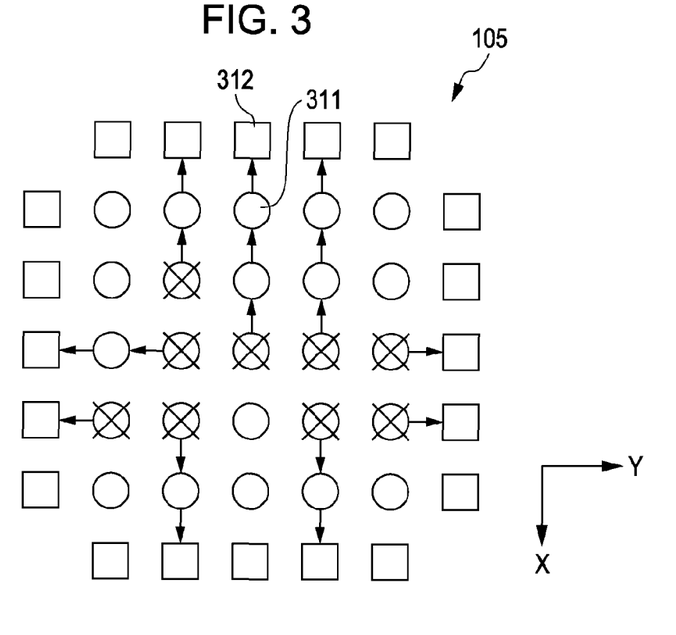
FIG. 3 is a top view of a deflector array according to an embodiment of the present invention.

FIG. 3 illustrates a view of the deflector array 105 shown in FIG. 1 as shown from above (from the side of the charged particle beam source). The main deflectors 311 are disposed at locations corresponding to those charged particle beams. In FIG. 3, the main deflectors 311 are illustrated by circles, and the auxiliary deflectors 312 are illustrated by squares. Symbols x are used to indicate defective main deflectors. As can be seen, when there are plurality of defective main deflectors, charged particle beams are controlled so as to bypass the defective main deflectors and pass through auxiliary deflectors by deflecting the charged particle beams in directions denoted by arrows.

Third Embodiment

Figure 4:
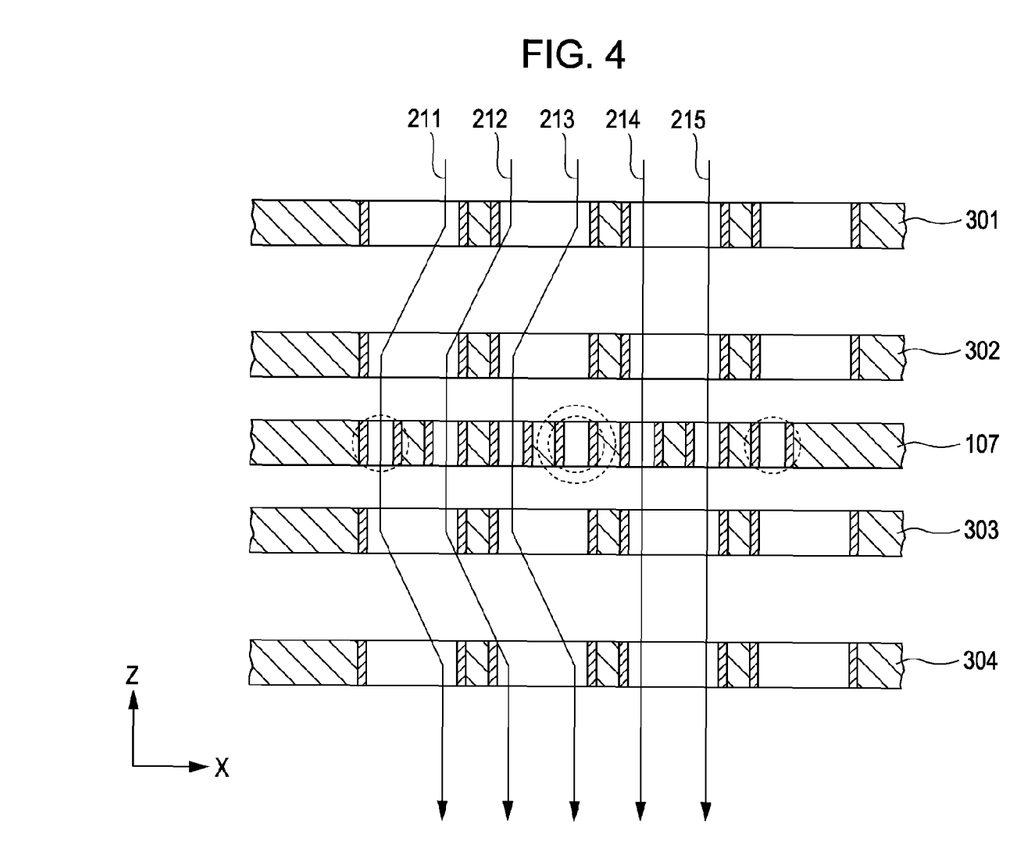
FIG. 4 is a diagram illustrating an operation of a deflector array according to an embodiment of the present invention.

A third embodiment is described below with reference to FIG. 4. The second embodiment is similar to the first embodiment except for what is described below. In this embodiment, the deflector arrays 301, 302, 303, and 304 are configured such that each deflector thereof is capable of deflecting a plurality of charged particle beams. In the present embodiment, by way of example, it is assumed that each deflector is capable of deflecting 2×2 charged particle beams. Note that there is no particular restriction on the number of charged particle beams deflected by one deflector. In the first embodiment described above, the deflector arrays 301 and 302 are disposed upstream of the deflector array 105. In contrast, in the third embodiment, the deflector arrays 301 and 302 are disposed upstream of the deflector array 107. Note that the deflector arrays 301 and 302 may be disposed differently. For example, the deflector arrays 301 and 302 may be disposed in a similar manner to the first embodiment.

Figure 5:
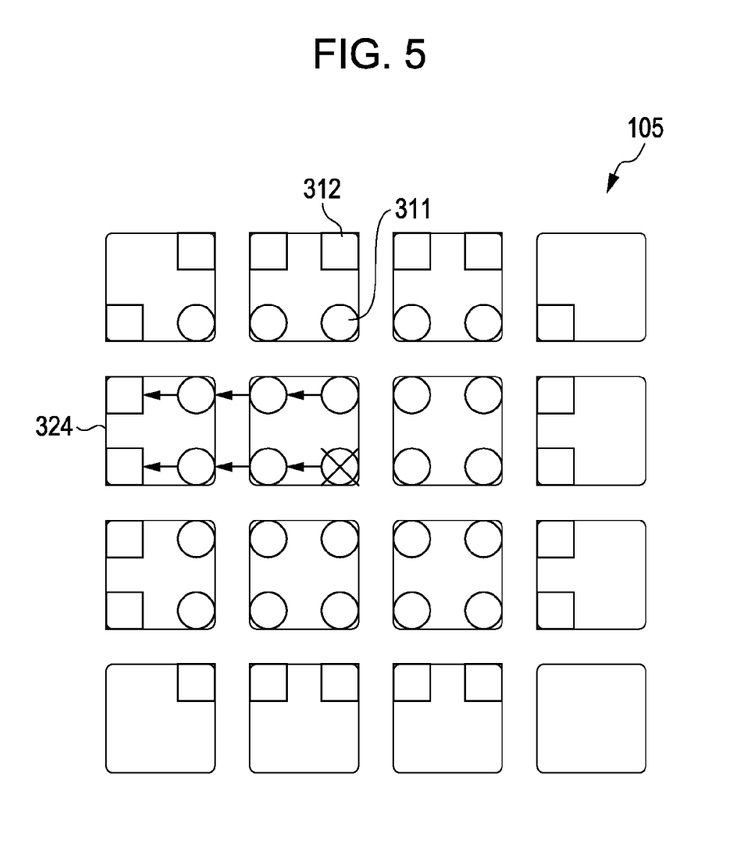
FIG. 5 is a top view of a deflector array according to an embodiment of the present invention.

FIG. 5 illustrates a view of the deflector array 107 as shown from above (from the side of the charged particle beam source). The main deflectors 311 are disposed at locations corresponding to charged particle beams. In FIG. 5, main deflectors 311 are illustrated by circles, and auxiliary deflectors 312 are illustrated by squares. Symbols x are used to indicate defective main deflectors. The deflectors 301 and 302 are capable of simultaneously deflecting all charged particle beams passing through an area denoted by reference numeral 324.

After charged particle beams 211, 212, and 213 pass through openings of the aperture array 103, the charged particle beams 211, 212, and 213 are deflected by the deflector array 301 such that the defective deflector 321 is bypassed. That is, the charged particle beams 211, 212, and 213 are deflected in a direction denoted by arrows 321c in FIG. 5. The deflection causes the charged particle beam 211 to be led to an auxiliary deflector of the deflector array 301. On the other hand, the charged particle beams 214 and 215 are not deflected by the deflector array 301.

The deflector array 303 deflects the charged particle beams 211, 212, and 213 such that the charged particle beams return to their previous positions in which the charged particle beams were located before they were deflected by the deflector array 301.

In the present embodiment, the deflectors of the deflector arrays 301, 302, 303, and 304 can be set to be great in size. That is, it is possible to configure each deflector to have a large opening between electrodes. This allows the deflector arrays 301, 302, 303, and 304 to be produced by a simple production process at a lower production cost in a shorter production time. The increase in size of the opening between electrodes of each deflector results in a reduction in the probability that some of deflectors of the deflector arrays 301, 302, 303, and 304 is defective.

Fourth Embodiment

Figure 6:
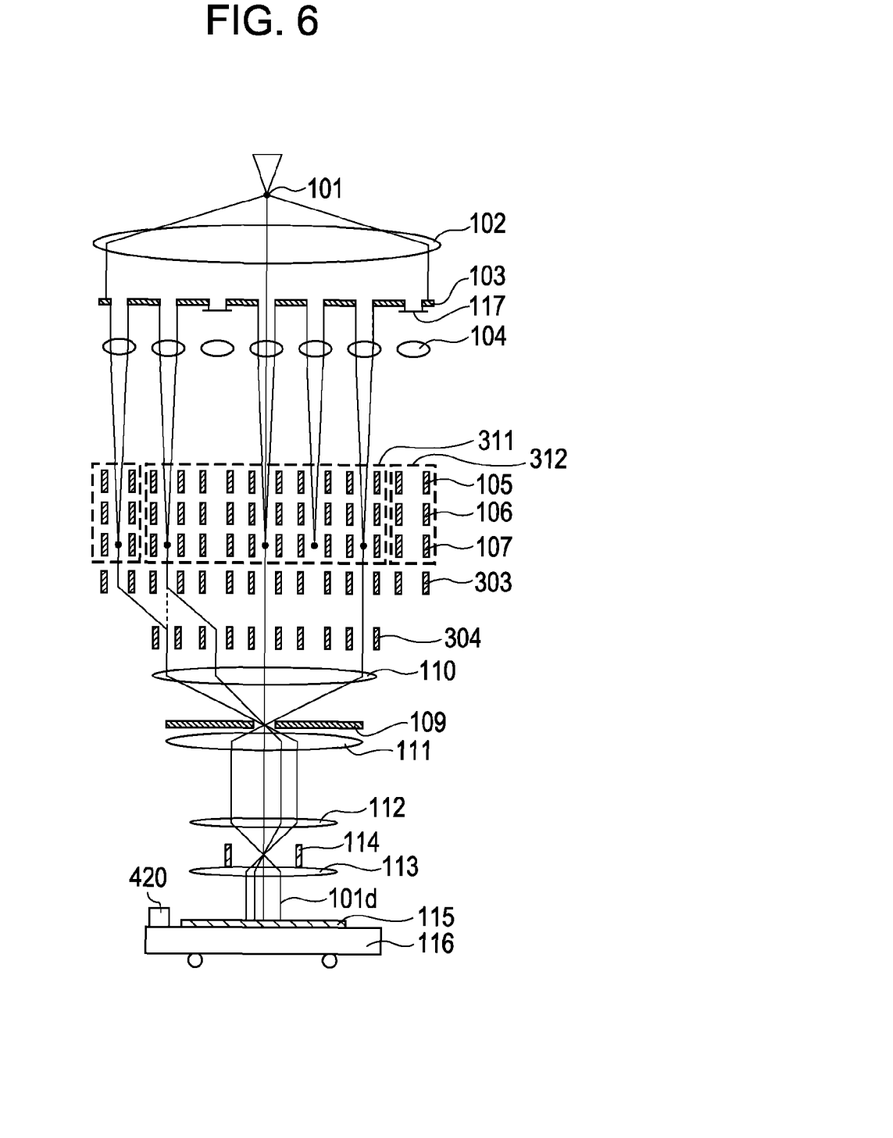
FIG. 6 is a diagram illustrating a multibeam-type charged particle beam writing apparatus according to an embodiment of the present invention.

Next, a fourth embodiment is described below with reference to FIG. 6. The fourth embodiment is similar to the first embodiment except for what is described below. In the fourth embodiment, the apparatus does not have the deflector arrays 303 and 304 used in the first embodiment, but the aperture array 103 has openings at locations corresponding to the auxiliary deflectors 312.

In the present embodiment, the charged particle beam writing apparatus has shutters 117 configured to open and close openings. When there is no defective deflector, the openings corresponding to the auxiliary deflectors 312 are closed in the writing process. When there is a defective deflector, an opening corresponding to the defective main deflector is closed and an opening corresponding to an auxiliary deflector 312 is opened. In the example shown in FIG. 6, the main deflector 311 has a defective deflector at a second position as measured from the left end.

In the present embodiment, even when there is no defect, charged particle beams are formed redundantly, and thus the present embodiment is disadvantageous in terms of energy consumption or unnecessary heat generation compared with the first embodiment. However, because the deflector arrays 301 and 302 are not provided, it is possible to reduce cost and prevent a trouble that can occur due to a failure of the deflector arrays 301 and 302.

Instead of providing the shutters, charged particle beams passing through defective deflectors may be deflected after the passage through the defective deflectors such that the charged particle beams are blocked by the blocking plate. This configuration may be combined with a technique disclosed in Japanese Patent Laid-Open No. 2005-116743.

Embodiment of Device Production Method

Devices (such as semiconductor integrated circuit devices, liquid crystal display devices, etc.) can be produced by a process including exposing a charged-particle sensitive resist coated on a substrate (such as a wafer, glass plate, etc.) by using an exposure apparatus according to one of the embodiments described above, and developing the exposed resist. The substrate is then subjected to a process including etching, resist removal, dicing, bonding, packaging, etc.

As described above, the charged particle beam writing apparatus according to one of the embodiments described above is capable of forming a pattern with a high throughput even when the charged particle beam writing apparatus includes a defective element.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-004126, filed Jan. 9, 2009, and No. 2009-262074 filed Nov. 17, 2009, which are hereby incorporated by reference herein in their entirety.

What is claimed is:

1. A charged particle beam writing apparatus comprising:
    an aperture array configured to be capable of forming a plurality of charged particle beams using a plurality of openings;
    an element array, including a plurality of main elements disposed on a predetermined plane and a plurality of auxiliary elements which are disposed on the predetermined plane and adjacent to the main elements, configured to apply an electromagnetic field to the plurality of charged particle beams; and
    a control unit configured to acquire information for specifying, from among the plurality of main elements, an element being unable to control the charged particle beam, and control the element array based on the acquired information,
    wherein the control unit is configured to control the element array such that only the main elements are used when there is no defect, while when there is a main element having a defect, both of the main elements other than the main element having the defect and the auxiliary element are used;
    wherein the plurality of main elements are disposed in an area opposing the plurality of openings;
    and wherein the plurality of auxiliary elements are disposed in an area different from the area where the plurality of main elements are disposed,
    and wherein the charged particle beam writing apparatus further comprises a first deflector array including a plurality of deflectors and configured to be capable of deflecting the plurality of charged particle beams such that part of the plurality of charged particle beams are led to the auxiliary element,
    and wherein the control unit controls the first deflector array in accordance with the information;
    and wherein the first deflector array is configured such that one deflector deflects a plurality of charged particle beams all together at once.

2. The charged particle beam writing apparatus according to claim 1, further comprising a second deflector array including a plurality of deflectors and configured to be capable of deflecting charged particle beams via the auxiliary element, wherein the control unit controls the second deflector array in accordance with the information.

3. The charged particle beam writing apparatus according to claim 2, further comprising a third deflector array disposed at a stage following the first or second deflector array and configured to be capable of deflecting the charged particle beams deflected by the first or second deflector array such that the charged particle beams are parallel to a direction of a main axis of the plurality of charged particle beams.

4. The charged particle beam writing apparatus according to claim 1, wherein the main elements and the auxiliary elements are deflectors.

5. A device production method comprising:
    exposing a substrate with a charged particle beam using the charged particle beam writing apparatus according to claim 1; and
    developing the exposed substrate.

* * * * *